United States Patent
Takamine

(10) Patent No.: US 6,873,227 B2
(45) Date of Patent: Mar. 29, 2005

(54) SURFACE ACOUSTIC WAVE FILTER, SURFACE ACOUSTIC WAVE DEVICE USING THE FILTER, AND COMMUNICATION DEVICE USING THE FILTER OR THE DEVICE

(75) Inventor: Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 389 days.

(21) Appl. No.: 10/104,519

(22) Filed: Mar. 23, 2002

(65) Prior Publication Data

US 2004/0070470 A1 Apr. 15, 2004

(30) Foreign Application Priority Data

Mar. 23, 2001 (JP) ........................................ 2001-084856
Aug. 20, 2001 (JP) ........................................ 2001-249405

(51) Int. Cl.[7] .............................. H03H 9/64; H03H 9/72
(52) U.S. Cl. .................... 333/133; 333/195; 310/313 D
(58) Field of Search ................................. 333/193–196, 333/133; 310/313 B, 313 D

(56) References Cited

U.S. PATENT DOCUMENTS 3,792,381 A * 2/1974 Bristol ....................... 333/193
5,485,052 A 1/1996 Seki et al. ............... 310/313 B
5,835,990 A 11/1998 Saw et al. ............... 310/313 D
5,844,453 A * 12/1998 Matsui et al. ................ 333/193
6,420,946 B1 * 7/2002 Bauer et al. ................. 333/193
6,556,100 B2 * 4/2003 Takamine .................... 333/133
6,583,691 B2 * 6/2003 Takamine .................... 333/195
6,621,380 B2 * 9/2003 Takamine .................... 333/195

FOREIGN PATENT DOCUMENTS

JP 05-267990 10/1993
JP 10-126212 5/1998

OTHER PUBLICATIONS

Korean Search Report dated Jun. 22, 2004, issued in the correspondent Korean Application 10–2002–0015843.

* cited by examiner

Primary Examiner—Barbara Summons
(74) Attorney, Agent, or Firm—Keating & Bennett, LLP

(57) ABSTRACT

A longitudinally coupled resonator type surface acoustic wave filter includes a small pitch electrode finger portion having electrode fingers of which the pitch is smaller than that of the other electrode fingers. The small pitch electrode finger portion is provided in the end of at least one of interdigital transducers which is adjacent to the other interdigital transducer. Moreover, the small pitch electrode finger portion includes two adjacent electrode fingers in at least one position thereof which are electrode-inverted so that the polarities of the two adjacent electrode fingers are made the same.

13 Claims, 8 Drawing Sheets

SURFACE ACOUSTIC WAVE FILTER, SURFACE ACOUSTIC WAVE DEVICE USING THE FILTER, AND COMMUNICATION DEVICE USING THE FILTER OR THE DEVICE

BACKGROUND OF THE INVENTION

1. Field of the Invention

The present invention relates to a longitudinally coupled resonator type surface acoustic wave filter, a surface acoustic wave device including such a filter, and a communication device including such a filter or such a surface acoustic wave device.

2. Description of the Related Art

In recent years, the number of subscribers to communication devices such as portable telephones and other devices has increased, and the services of the communication devices have become more diversified. For this reason, communication devices of which the transmission-side frequency band and the reception-side frequency band are located near each other have been increased in number. Moreover, it is necessary to provide a desired amount of attenuation in the immediate vicinity of a pass band, depending on the types of communication devices so that interference between the communication devices and other communication devices can be prevented. For surface acoustic wave filters widely used as band-pass filters in the RF stages of portable telephones, it has been more intensively required to provide a desired amount of attenuation in the vicinity of a pass band.

Moreover, for the purpose of reducing the number of parts contained in such a surface acoustic wave filter, it has been increasingly demanded to provide a balanced-unbalanced signal conversion function, a so-called balun function, for the surface acoustic wave filter. For this reason, the use of longitudinally coupled resonator type surface acoustic wave filters as band pass filters in the RF stages of portable telephones has become the standard, since the filters can easily provide the balanced-unbalanced signal conversion function. For example, Japanese Unexamined Patent Application Publication No. 5-267990 discloses such a longitudinally coupled resonator type surface acoustic wave filter.

In the above-described longitudinally coupled resonator type surface acoustic wave filters of the related art, disadvantageously, deterioration of a "shoulder"-characteristic (the reduction in steepness of a frequency characteristic), called transversal response is caused on the higher frequency side of a pass band. Therefore, there are problems in that attenuation on the higher frequency side of the pass band is not satisfactory, although it is required by communication devices which operate in a PCS system (Personal Communication System) or other telecommunications systems. As a filter having a large amount of attenuation on the higher frequency side of a pass band, for example, Japanese Unexamined Patent Application Publication No. 10-126212 discloses a ladder type surface acoustic wave device. However, it is problematic that the balanced-unbalanced conversion function can not be provided by ladder type surface acoustic wave filters. That is, according to the related art, it has been difficult to produce a surface acoustic wave device having a sufficient amount of attenuation on the higher frequency side of the pass band and also having a balanced-unbalanced conversion function.

SUMMARY OF THE INVENTION

In order to overcome the problems described above, preferred embodiments of the present invention provide a longitudinally coupled resonator type surface acoustic wave filter having a transversal response that is considerably reduced compared with a surface acoustic wave filter of the related art, while providing a balanced-unbalanced signal conversion function.

According to a preferred embodiment of the present invention, a longitudinally coupled resonator type surface acoustic wave filter includes a piezoelectric substrate, and at least two interdigital transducers (IDTs) arranged on the piezoelectric substrate along the direction in which a surface acoustic wave is propagated, at least one of the interdigital transducers being provided with a small pitch electrode finger portion at the end thereof which is adjacent to the other interdigital transducer, the small pitch electrode finger portion having electrode fingers with a pitch that is smaller than that of the other electrode fingers in the at least one interdigital transducer, the small pitch electrode finger portion including two adjacent electrode fingers in at least one position thereof which are electrode-inverted such that the polarities of the two adjacent electrode fingers are the same.

Preferably, the position where the electrode-inversion is carried out is located at the approximate center of the small pitch electrode finger portion.

Also, preferably, the electrode-inversion is carried out symmetrically with respect to the approximate center of the surface acoustic wave filter.

Preferably, the polarities of the adjacent electrode fingers contained in the adjacent interdigital transducers, respectively, are made different from each other.

Moreover, according to a preferred embodiment of the present invention, a surface acoustic wave device has a balanced-unbalanced conversion function and includes the above-described longitudinally coupled resonator type surface acoustic wave filter.

Furthermore, according to another preferred embodiment of the present invention, a communication device includes the above-described longitudinally coupled resonator type surface acoustic wave filter or the above-described surface acoustic wave device according to other preferred embodiments of the present invention.

The surface acoustic wave filter of various preferred embodiments of the present invention is advantageous in that the transversal response is greatly reduced, since two adjacent electrode fingers in the small pitch electrode finger portion are electrode-inverted, that is, the polarities of the adjacent electrode fingers are the same. Moreover, the longitudinally coupled resonator type surface acoustic wave filter is advantageous in that the pass band width is very large, and the transversal response is greatly reduced, since preferably the position where the electrode-inversion is carried out is located at the approximate center of the small pitch electrode finger portion.

Furthermore, advantageously, in the longitudinally coupled resonator type surface acoustic wave filter, a ripple is eliminated from the pass band, and the transversal response is greatly reduced, since the electrode inversion is preferably carried out symmetrically with respect to the approximate center of the surface acoustic wave filter.

In addition, the transversal response is even more reduced along a wider range, since the polarities of the adjacent electrode fingers contained in the adjacent interdigital transducers, respectively, are preferably made different from each other.

The surface acoustic wave filter having a balanced-unbalanced conversion function according to a preferred embodiment of the present invention is advantageous in that the amount of attenuation on the higher frequency side of the pass band is greatly improved, since the device includes the surface acoustic wave filter according to other preferred embodiments of the present invention.

The communication device of other preferred embodiments of the present invention is advantageous in that the communication qualities are superior and the reliability is high, since the device includes the longitudinally coupled resonator type surface acoustic wave filter or surface acoustic wave device according to the other preferred embodiments of the present invention.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, the longitudinally coupled resonator type surface acoustic wave filter and the surface acoustic wave device according to preferred embodiments of the present invention will be described with reference to FIGS. 1 to 13.

Figure 1:
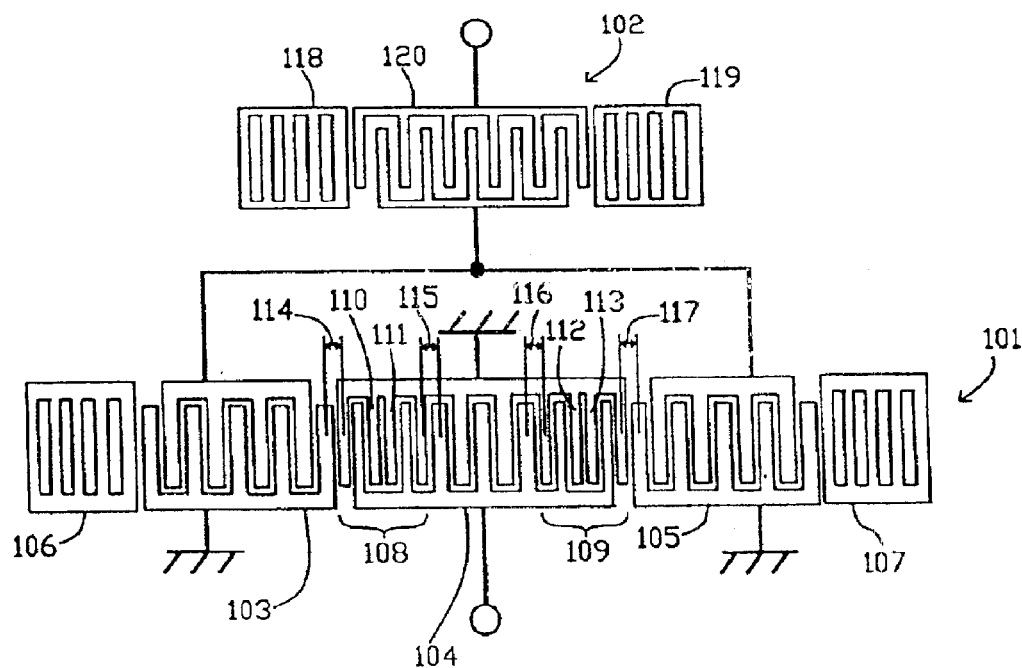
FIG. 1 is a schematic plan view showing the configuration of a first preferred embodiment of the present invention.

FIG. 1 is a schematic plan view showing the configuration of a first preferred embodiment of the present invention. In all of the preferred embodiments of the present invention, filters for PCS-Rx are described by way of an example, and the present invention is not in any way limited thereto.

In the configuration of the first preferred embodiment of the present invention shown in FIG. 1, a longitudinally coupled resonator type surface acoustic wave filter 101 and a surface acoustic wave resonator 102 are disposed on a substrate that is preferably made of 40±5° Y-cut X-propagation $LiTaO_3$, using Al electrodes. In this preferred embodiment, the surface acoustic wave resonator 102 is connected in series with the longitudinally coupled resonator type surface acoustic wave filter 101. The longitudinally coupled resonator type surface acoustic wave filter 101 preferably includes IDTs 103, 104, and 105, and two reflectors 106 and 107 arranged so as to sandwich the IDTs 103, 104, and 105. A plurality of electrode fingers connected to the ground and a plurality of electrode fingers connected to a signal line are arranged so as to be opposed to each other in each of the IDTs 103, 104, and 105. The surface acoustic wave resonator 102 comprises IDT 120 and two reflectors 118 and 119 arranged so as to sandwich the IDT 120. In the IDT 120, a plurality of electrode fingers connected to a signal line and a plurality of electrode fingers connected to the IDTs 103 and 105 are arranged so as to be opposed to each other. It should be noted that in FIG. 1, the number of electrode fingers is reduced for simplification.

As shown in FIG. 1, small pitch electrode finger portions 108 and 109 are provided in the longitudinally coupled resonator type surface acoustic wave filter 101. Several electrode fingers of the IDT 104 adjacent to the IDT 103 and several electrode fingers of the IDT 104 adjacent to the IDT 105 having a smaller pitch compared with the pitch of the electrode fingers remaining in the IDT 104 are arranged in the small pitch electrode finger portions 108 and 109, respectively. The polarities of electrode fingers 110 and 111 adjacent to each other in the small pitch electrode finger portion 108, and also, those of electrode fingers 112 and 113 adjacent to each other in the small pitch electrode finger portion 109 are made the same, respectively. That is, the electrodes are inverted. Specifically, for example, the polarity of the electrode fingers connected to the ground is expressed as minus (−), while the polarity of the electrodes connected to the signal line is expressed as plus (+). The array of the polarities (−,+) is represented by +1, the array of the polarities (+,−) is denoted by −1, and the array of the polarities (−,−) or (+,+) by 0. Then, the polarities of the electrode fingers in the small pitch electrode finger portion 108 shown in FIG. 1 are arranged in the order from the left-side end of +1, −1, 0, +1, −1. Those of the electrode fingers in the small pitch electrode finger portion 109 are arranged in the order from the left-side end of +1, −1, 0, +1, −1. That is, the electrode inversion is carried out symmetrically with respect to the approximate center of the longitudinally coupled resonator type surface acoustic wave filter 101. Even if the electrode inversion is carried out unsymmetrically with respect to the approximate center of the filter 101, it is effective in reducing the transversal response according to preferred embodiments of the present invention. However, a ripple is generated in the pass band. Thus, such a symmetric configuration as in this preferred embodiment is desirable.

The details of an example of the design of the longitudinally coupled resonator type surface acoustic wave filter 101 are as follows. In the details, the wavelength determined by the pitch of the small pitch electrode fingers is designated by $\lambda$I2, and the wavelength determined by the remaining electrode fingers is denoted by $\lambda$I1.

the meshing-width W: 73.9 $\lambda$I1
the number of electrode fingers in the IDT 103: 17
the number of electrode fingers in the IDT 104: 45 (of the electrode fingers, the pitch of the six electrode fingers arranged from each of the right- and left-side ends is decreased)
the number of electrode fingers in the IDT 105: 17
the wavelength $\lambda$I1 determined by the IDTs: 2.03 $\mu$m
the wavelength $\lambda$I2: 1.85 $\mu$m
the wavelength $\lambda$R determined by the reflectors: 2.06 $\mu$m
the number of electrode fingers in the reflectors: 100
the intervals (114, 117) between the IDTs 103 and 104 and the IDTs 104 and 105: 0.25 $\lambda$I1+0.25 $\lambda$I2
the intervals (115, 116) between the electrodes adjacent to each other determining the wavelengths $\lambda$I1 and $\lambda$I2 in the IDT 104: 0.25 $\lambda$I1+0.25 $\lambda$I2
the intervals between the IDTs 103, 105 and the reflectors 106, 107: 0.48 $\lambda$R
the duty of the IDTs: 0.60
the duty of the reflectors: 0.60
the film-thickness of the electrodes: 0.08 $\lambda$.

Figure 2:
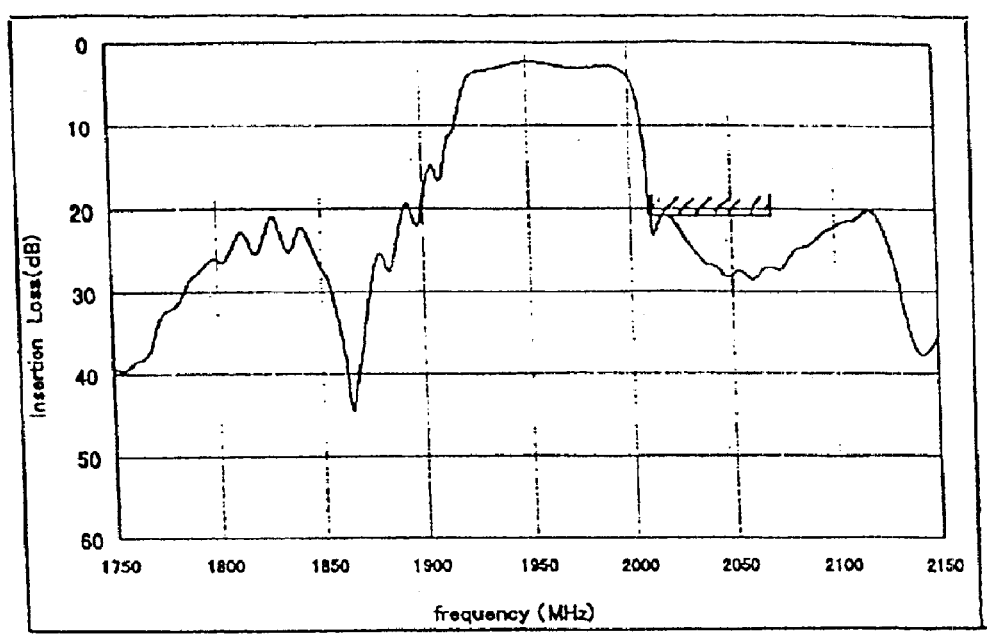
FIG. 2 is a graph showing the frequency characteristic of the first preferred embodiment of the present invention which has the configuration shown in FIG. 1.
Figure 3:
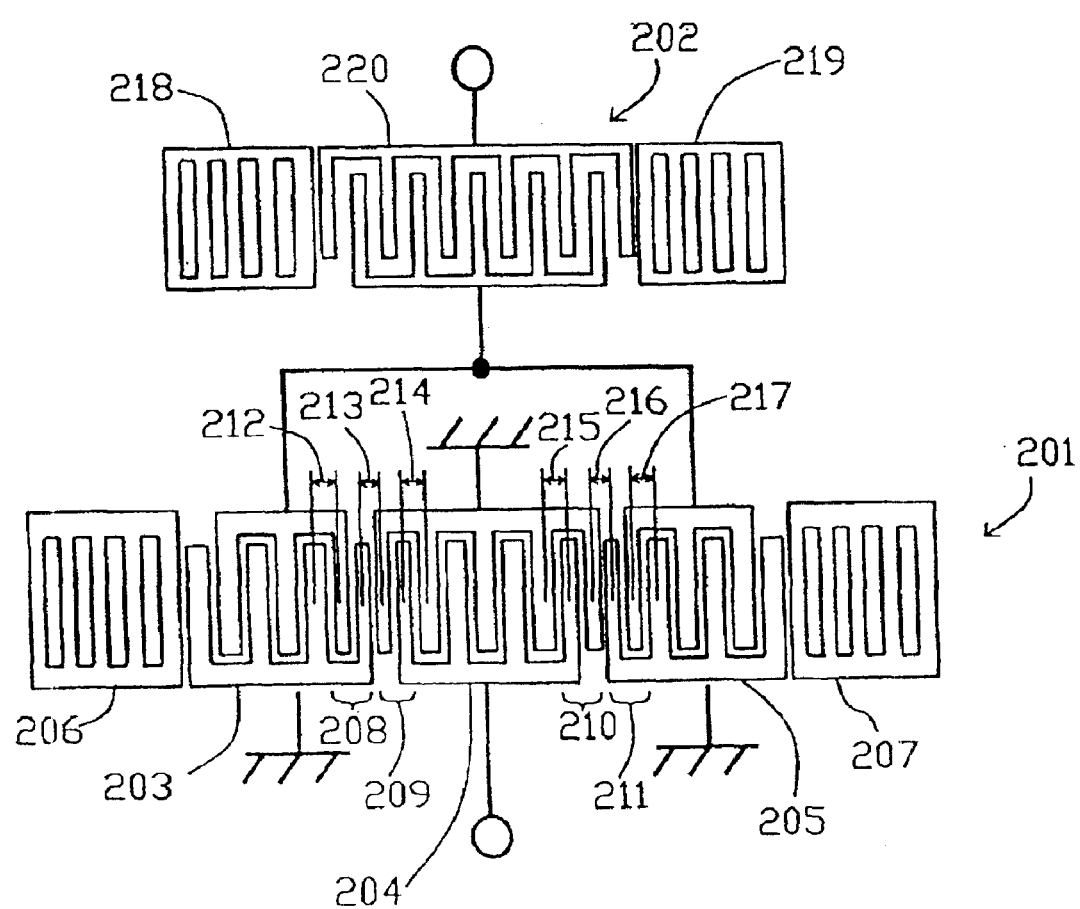
FIG. 3 is a schematic plan view showing the configuration of an example according to the related art.
Figure 4:
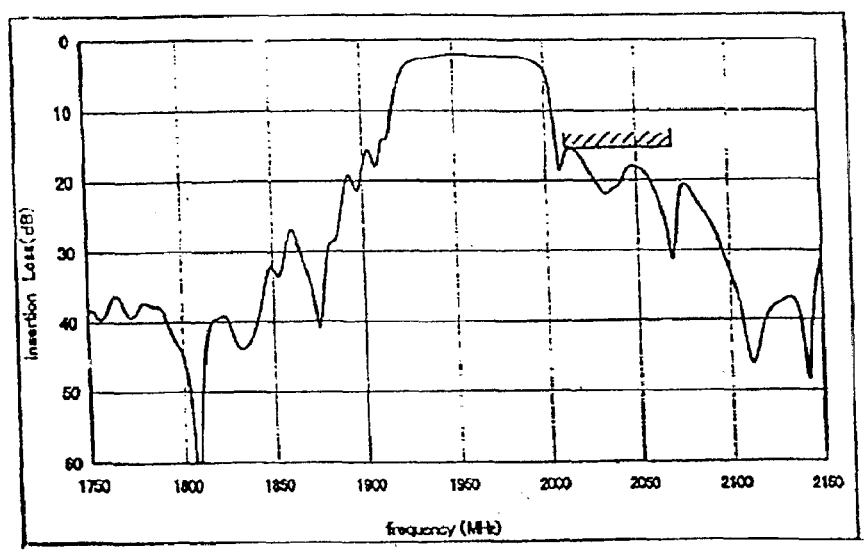
FIG. 4 is a graph showing the frequency characteristic of the example of the related art which has the configuration shown in FIG. 3.

Moreover, the details of an example of the design of the surface acoustic wave resonator 102 are as follows:

the meshing-width W: 29.5 $\lambda$
the number of electrode fingers in the IDT 120: 401
the wavelength $\lambda$ (for the IDT 120 and the reflectors 118 and 119): 2.03 $\mu$m
the number of electrode fingers in the reflectors 118 and 119: 30
the intervals between the IDT 120 and the reflectors 118 and 119: 0.50 $\lambda$
the duty of the IDT 120: 0.60
the duty of the reflectors 118 and 119: 0.60
the film-thickness of the electrodes: 0.08 $\lambda$ FIG. 2 shows the frequency characteristic of the first preferred embodiment of the present invention. FIG. 3 is a schematic plan view showing an example of the related art by way of comparison. FIG. 4 shows the frequency characteristic of the related art example shown in FIG. 3.

Referring to the configuration of the related art example shown in FIG. 3, a surface acoustic wave resonator 202 is connected in series with a longitudinally coupled resonator type surface acoustic wave filter 201 similarly to the first preferred embodiment. The longitudinally coupled resonator type surface acoustic wave filter 201 preferably includes three IDTs 203, 204, and 205 and two reflectors 206 and 207, and small pitch electrode finger portions 208 to 211 are provided in the positions where the IDTs 203 and 204 and the IDTs 204 and 205 are adjacent to each other, respectively, similarly to the longitudinally coupled resonator type surface acoustic wave filter 101 of the first preferred embodiment. The surface acoustic wave resonator 202 includes one IDT 220 and two reflectors 218 and 219, similarly to the surface acoustic wave resonator 102 of the first preferred embodiment.

The details of the design of the longitudinally coupled resonator type surface acoustic wave filter 201 of the related art example will be described below.

the meshing width W: 60.6 $\lambda$I1
the number of electrode fingers in the IDT 203: 33 (the pitch of the four electrode fingers, arranged from the right-side end is decreased)
the number of electrode fingers in the IDT 204: 51 (the pitch of the four electrode fingers arranged from the right- and left-side ends, respectively, is decreased)
the number of electrode fingers in the IDT 205: 33 (the pitch of the four electrode fingers arranged from the left-side end is decreased)
the wavelength $\lambda$I1 determined by the IDT: 2.06 $\mu$m
the wavelength $\lambda$I2: 1.88 $\mu$m
the wavelength $\lambda$R determined by the reflectors 206 and 207: 2.06 $\mu$m
the number of electrode fingers in the reflectors 206 and 207: 100
the intervals (212, 214, 215, 217 in FIG. 3) between the adjacent electrode fingers determining the wavelengths $\lambda$I1 and $\lambda$I2, respectively: 0.25 $\lambda$I1+0.25 $\lambda$I2
the intervals (213, 216 in FIG. 3) between the IDTs 203 and 204 and the IDTs 204 and 205, that is, the intervals between the adjacent electrodes determining the wavelength $\lambda$I2 in the IDTs 203 and 204 and between the adjacent electrodes determining the wavelength $\lambda$I2 in the IDTs 204 and 205: 0.50 $\lambda$I2
the intervals between the IDT 203 and 205 and the reflectors 206 and 207: 0.465 $\lambda$R
the duty (for the IDTs and the reflectors): 0.60
the film-thickness of the electrodes: 0.08 $\lambda$I1

The details of the design of the surface acoustic wave resonator 202 of the related art example are as follows.

the meshing-width W: 49.1 $\lambda$
the number of electrode fingers in the IDT 220: 401
the wavelength $\lambda$ (for the IDT 220 and the reflectors 218 and 219): 2.04 $\mu$m
the number of electrode fingers in the reflectors 218 and 219: 30
the intervals between the IDT 220 and the reflectors 218 and 219: 0.50 $\lambda$
the duty (for the IDT 220 and the reflectors 218, 219: 0.60
the film-thickness of the electrodes: 0.08 $\lambda$ The comparison of FIGS. 2 and 4 shows that the attenuation in the frequency range of about 2010 MHz to about 2070 MHz, which is on the higher frequency side of the pass band, in the first preferred embodiment according to the present invention, is improved by about 5 dB compared with that of the related art example. The reason for this improvement is that the transversal response in the first preferred embodiment is reduced compared with that in the related art example.

Figure 5:
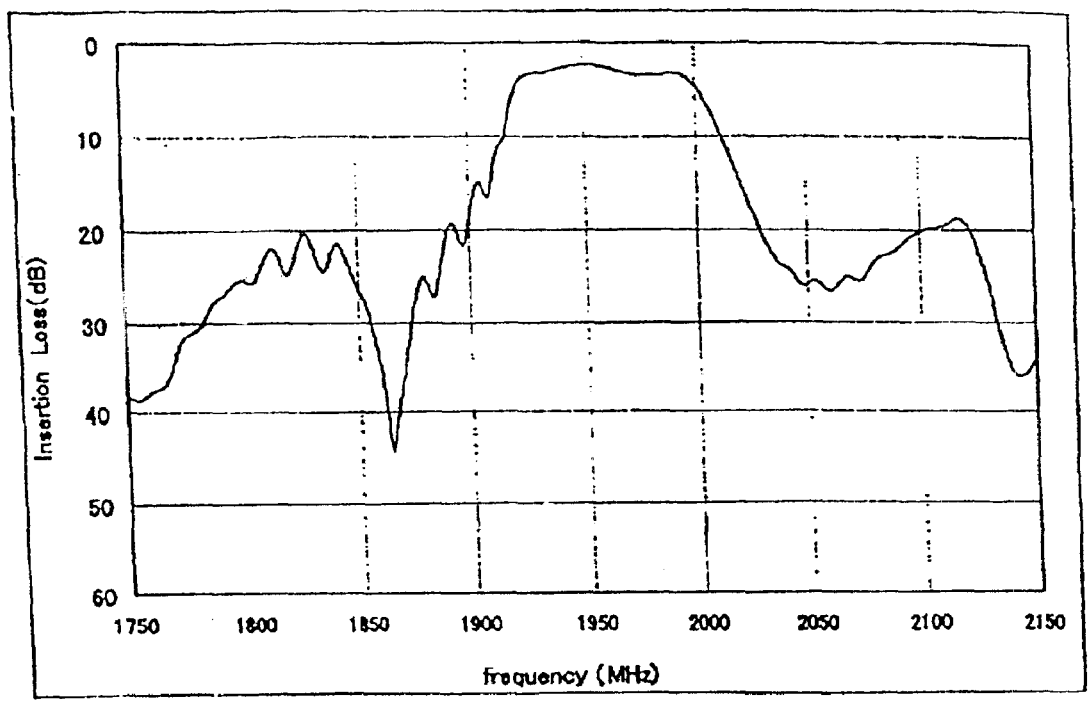
FIG. 5 is a graph showing the frequency characteristic of only the longitudinally coupled resonator type surface acoustic wave filter according to the first preferred embodiment of the present invention.
Figure 6:
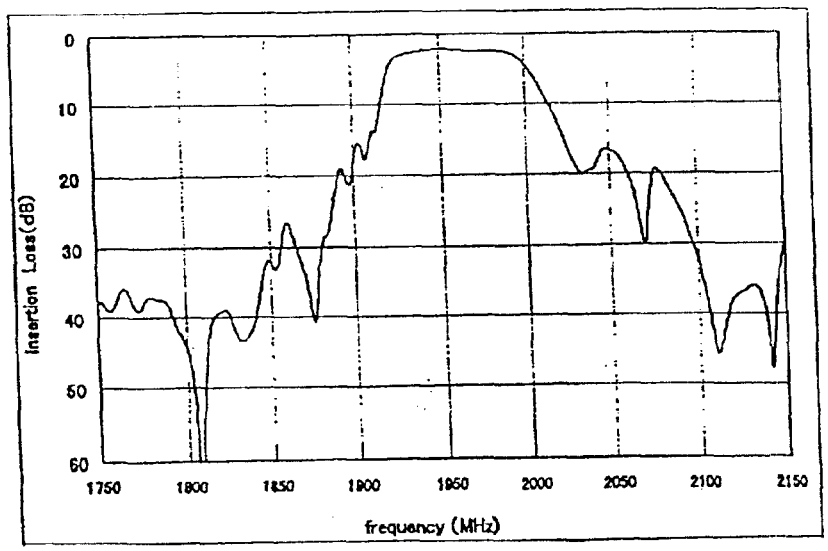
FIG. 6 is a graph showing the frequency characteristic of only the longitudinally coupled resonator type surface acoustic wave filter according to the related art example.

FIG. 5 shows the frequency characteristic of only the longitudinally coupled resonator type surface acoustic wave filter 101 of the first preferred embodiment according to the present invention. FIG. 6 shows the frequency characteristic of only the longitudinally coupled resonator type surface acoustic wave filter 201 of the related art example. The comparison of FIGS. 5 and 6 shows that the transversal response caused by the longitudinally coupled resonator type surface acoustic wave filter 101 is greatly reduced. Thus, it is seen that the effects of the present invention are obtained by the electrode-inversion in the small pitch electrode finger portions 108 and 109 of the longitudinally coupled resonator type surface acoustic wave filter 101.

According to the first preferred embodiment of the present invention, the position where the electrode inversion is carried out is located at the approximate center of each small-pitch electrode finger portion, by way of example.

Figure 7:
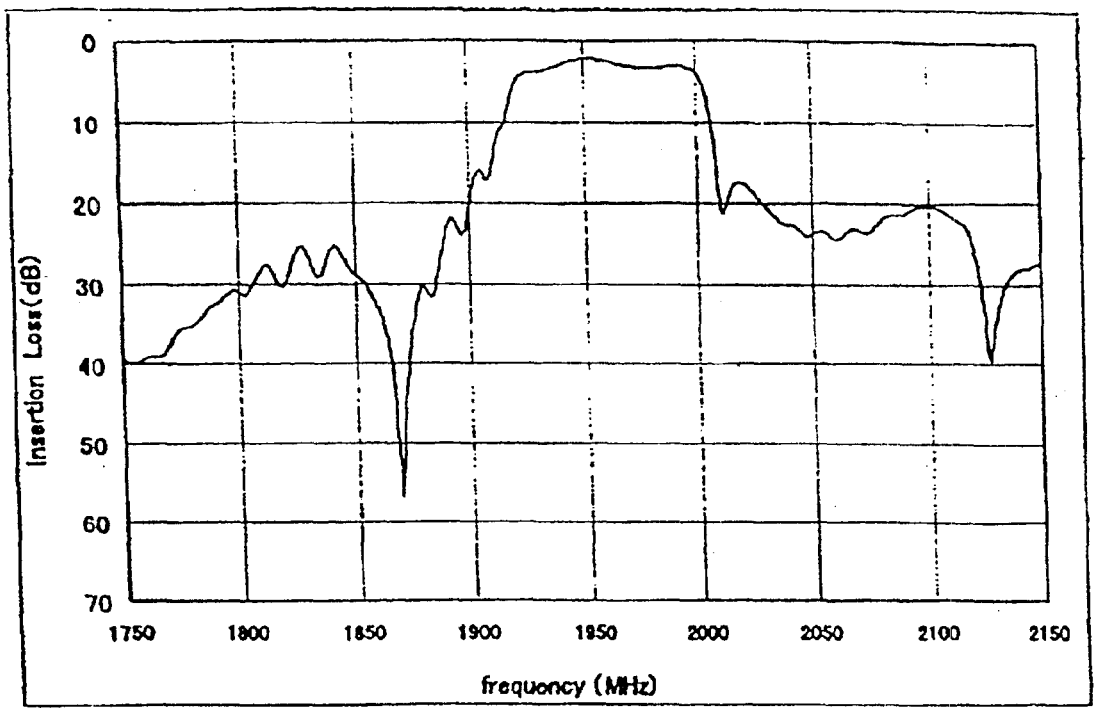
FIG. 7 is a graph showing the frequency characteristic of the first preferred embodiment of the present invention having the same configuration as shown in FIG. 1 except that the positions for the electrode-inversion are changed to be on the inner side.
Figure 8:
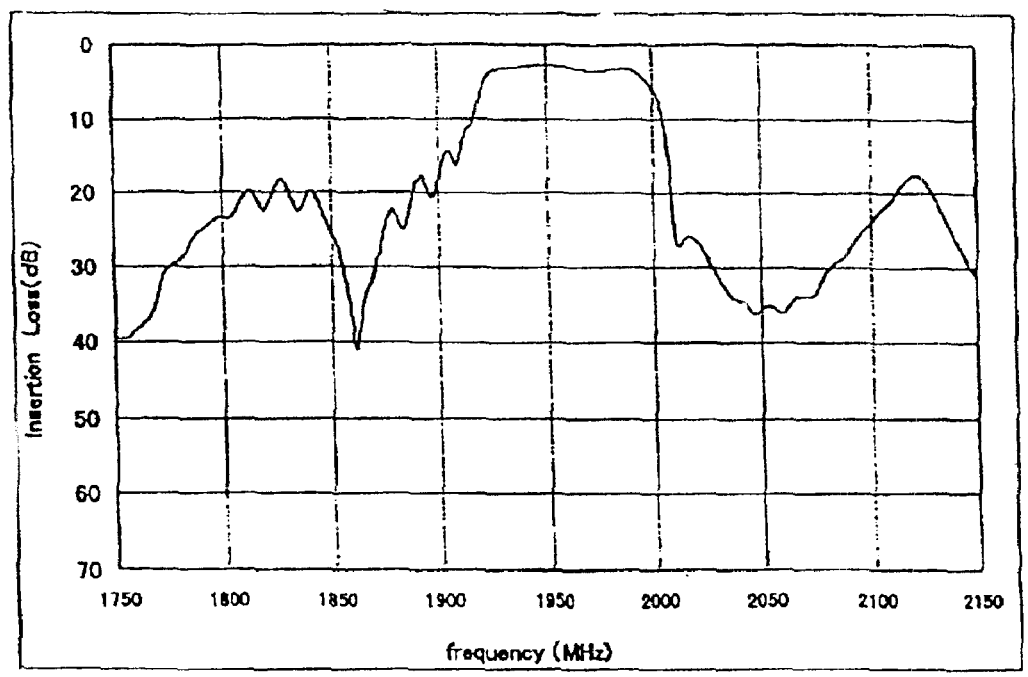
FIG. 8 is a graph showing the frequency characteristic of the first preferred embodiment of the present invention having the same configuration as shown in FIG. 1 except that the positions for the electrode-inversion are changed to be on the outer side.

Next, the frequency characteristics obtained when the position of the electrode inversion is changed from that of the first preferred embodiment will be described. FIG. 7 shows the frequency characteristic obtained when the position for the electrode inversion is shifted toward the inner side of the filter compared with that of the first preferred embodiment, specifically, when the polarities of the electrode fingers in the small pitch electrode finger portion 108 are arranged in the order from the left-hand side of +1, −1, +1, 0, −1, while those in the small pitch electrode finger portion 109 are arranged in the order from the left-hand side of +1, 0, −1, +1, −1. FIG. 8 shows the frequency characteristic obtained when the position for the electrode inversion is shifted toward the outer side of the filter compared with that of the first preferred embodiment, specifically, when the polarities of the electrode fingers in the small pitch electrode finger portion 108 are arranged in the order from the left-hand side of +1, 0, −1, +1, −1, while those in the small pitch electrode finger portion 109 are arranged in the order from the left-hand side of +1, −1, +1, 0, −1.

Referring to FIG. 7, the level of the transversal response is deteriorated compared with that shown in FIG. 2. Referring to FIG. 8, the transversal response is reduced compared with that shown in FIG. 2. However, the level of the response near the frequency of about 2120 MHz is deteriorated, and moreover, the pass band width is decreased. As described above, even if the position for the electrode inversion is changed from that in the first preferred embodiment, it is also effective in reducing the transversal response. However, from the standpoint of the wholly balanced electrical characteristics, it is preferable that the electrode inversion is carried out approximately at the center of each small pitch electrode finger portion as in the first preferred embodiment of the present invention.

As described above, according to the first preferred embodiment of the present invention, a longitudinally coupled resonator type surface acoustic wave filter having a transversal response that is greatly reduced compared with the longitudinally coupled resonator type surface acoustic wave filter of the related art can be obtained. In the first preferred embodiment, the electrode inversion is carried out in the small pitch electrode finger portions of the middle IDT of the three IDTs. However, small pitch electrode finger portions may be provided in the IDTs on the right and left sides of the middle IDT, and the electrode inversion is carried out in the small pitch electrode finger portions, respectively. By this, the effects and advantages of preferred embodiments of the present invention can be also obtained.

In the first preferred embodiment, the substrate made of 40±5° Y-cut X-propagation LitaO$_3$ is preferably used, but this is not restrictive. The same effects can be obtained when substrates made of an approximately 64° to 72° Y-cut X-propagation LiNbO$_3$, 41° Y-cut X-propagation LiNbO$_3$, and other suitable substrates are used. Moreover, in the above-described configuration of the first preferred embodiment, the surface acoustic wave resonator is preferably connected in series with the three IDTs longitudinally coupled resonator type surface acoustic wave filter. However, other configurations may also be used. For example, by using a two IDTs-containing configuration, an at least four IDTs-containing multi-electrode configuration, or a configuration in which the longitudinally coupled resonator type surface acoustic wave filters according to preferred embodiments of the present invention are connected in series in two stages, the same effects as those of the first preferred embodiment can be obtained.

Figure 9:
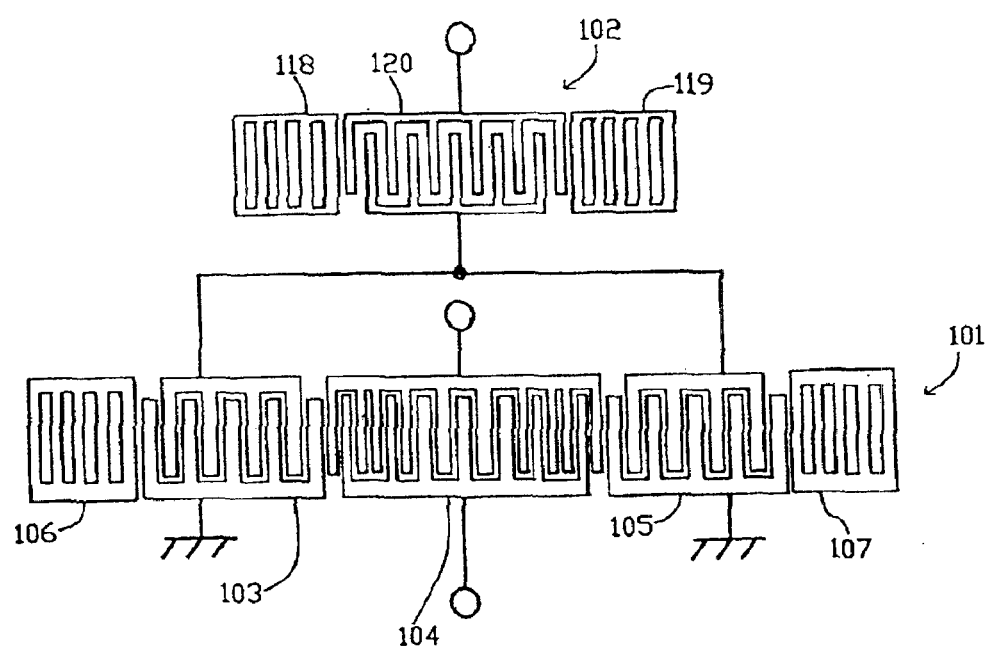
FIG. 9 is a schematic plan view of the first preferred embodiment of the present invention having a configuration different from that shown in FIG. 1.

As shown in FIG. 9, a surface acoustic wave filter having an unbalanced-balanced conversion function may be provided by changing, in the configuration of FIG. 1, the ground terminal of the IDT in the approximate center of the three IDTs to a signal terminal, and connecting the signal terminal to upper and lower bus bars for differential operation.

Figure 10:
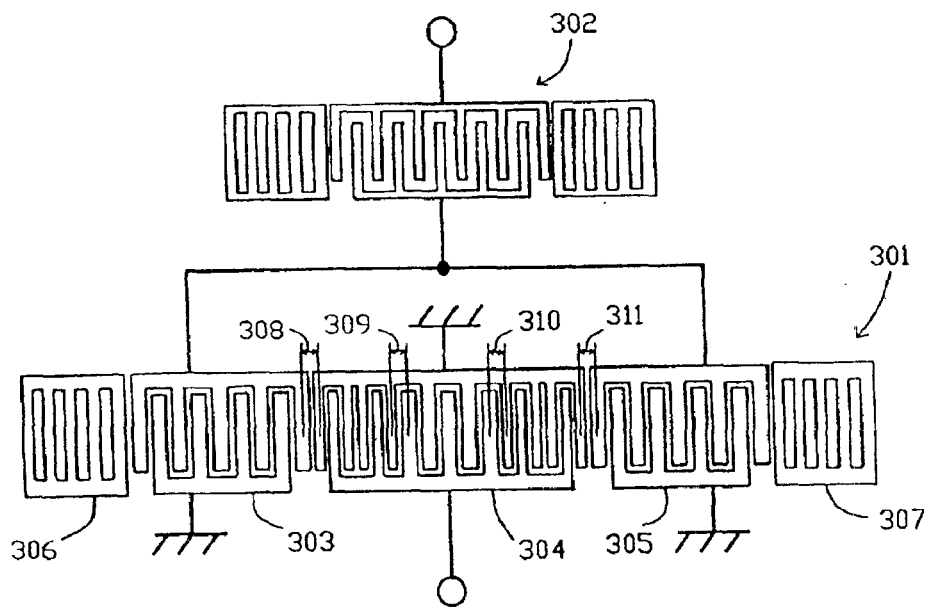
FIG. 10 is a schematic plan view showing the configuration of a second preferred embodiment of the present invention.

Next, the configuration of a second preferred embodiment of the present invention will be described with reference to FIG. 10. FIG. 10 is a schematic plan view showing the configuration of the second preferred embodiment of the present invention.

The second preferred embodiment preferably has substantially the same configuration as the first preferred embodiment according to the present invention except that the electrode inversion is carried out for IDTs 303 and 305 in contrast to the IDTs 103 and 105 of the first preferred embodiment. Thereby, the polarities of the adjacent electrode fingers contained in the different IDTs, respectively, are made different.

Figure 11:
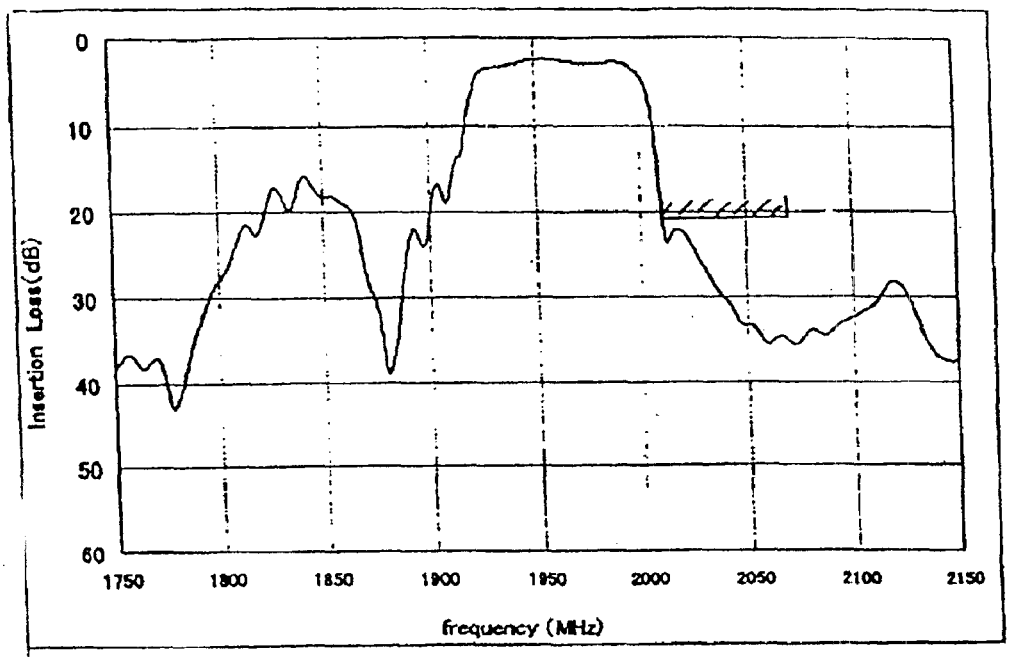
FIG. 11 is a graph showing the frequency characteristic of the second preferred embodiment of the present invention which has the configuration shown in FIG. 10.

The details of an example of the design of the longitudinally coupled resonator type surface acoustic wave filter 301 are as follows. In the details, the wavelength determined by the pitch of the small pitch electrode fingers is designated by $\lambda I2$, and the wavelength determined by the other electrode fingers is denoted by $\lambda I1$.

the meshing-width W: 64.0 $\lambda I1$
the number of electrode fingers in the IDT 303: 17
the number of electrode fingers in the IDT 304: 45 (the pitch of the six electrode fingers of these electrode fingers, which are arranged from each of the right- and left-side ends, is decreased)
the number of electrode fingers in the IDT 305: 17
the wavelength $\lambda I1$ determined by the IDTs: 2.03 $\mu$m
the wavelength $\lambda I2$: 1.85 $\mu$m
the wavelength $\lambda R$ determined by the reflectors 306 and 307: 2.06 $\mu$m
the number of electrode fingers in the reflectors 306 and 307: 100
the intervals 308 and 311 between the IDTs 303 and 304 and between the IDTs 304 and 305: 0.25 $\lambda I1$+0.25 $\lambda I2$
the intervals 309 and 310 between the adjacent electrode fingers determining the wavelengths $\lambda I1$ and $\lambda I2$ in the IDT 304: 0.25 $\lambda I1$+0.25 $\lambda I2$
the intervals between the IDTs 305, 303 and the reflectors 306, 307: 0.46 $\lambda R$
the duties of the IDTs and the reflectors: 0.60
the film-thickness of the electrode fingers: 0.08 $\lambda I1$ Moreover, the details of an example of the design of the surface acoustic wave resonator 302 are as follows.

the meshing-width W: 32.0 $\lambda$
the number of electrode fingers in the IDT: 401
the wavelengths $\lambda$ (for the IDT and the reflectors): 2.03 $\mu$m
the number of electrode fingers in the reflectors: 30
the intervals between the IDT and the reflectors: 0.50 $\lambda$
the duty of the IDT and the reflectors: 0.60
the film-thickness of the electrodes: 0.08 $\lambda$ FIG. 11 shows the frequency characteristic of the second preferred embodiment according to the present invention.

Figure 12:
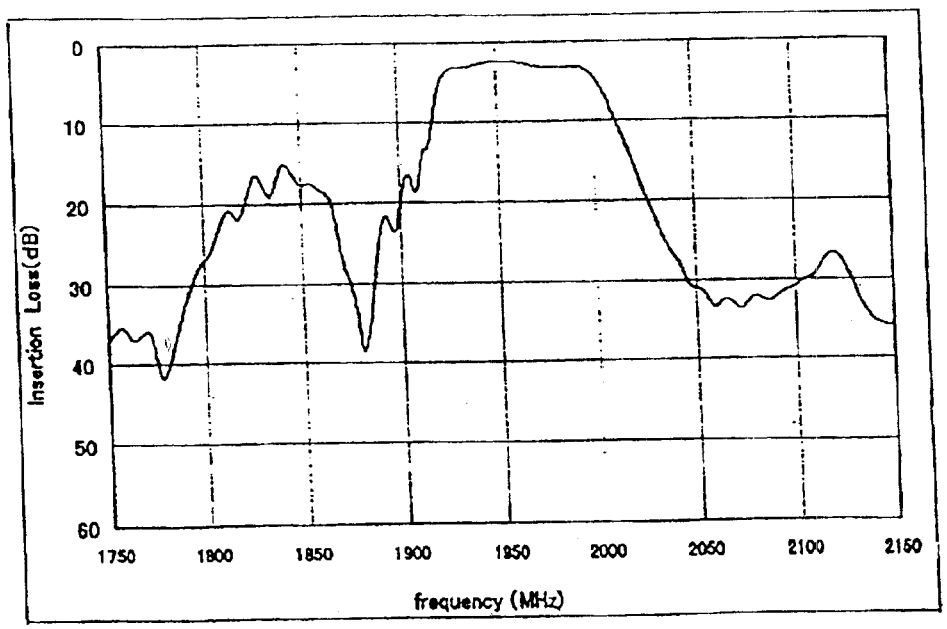
FIG. 12 is a graph showing the frequency characteristic of only the longitudinally coupled resonator type surface acoustic wave filter according to the second preferred embodiment of the present invention.

Moreover, FIG. 12 shows the frequency characteristic of only the longitudinally coupled resonator type surface acoustic wave filter 301.

According to the second preferred embodiment of the present invention, the amount of attenuation on the higher frequency side of the pass band is more improved compared with that of the first preferred embodiment. Especially, the amount of attenuation in the frequency range of at least about 2070 MHz is improved by about 8 dB. Moreover, as seen in the frequency characteristic of FIG. 12 which is generated only by the longitudinally coupled resonator type surface acoustic wave filter 301, the transversal response is significantly improved compared with that of the first preferred embodiment.

Thus, according to the second preferred embodiment of the present invention, the polarities of the adjacent electrode fingers contained in the different IDTs, respectively, are made different, and thereby, the longitudinally coupled resonator type surface acoustic wave filter of which the transversal response is further improved compared with that of the first preferred embodiment can be obtained.

Figure 13:
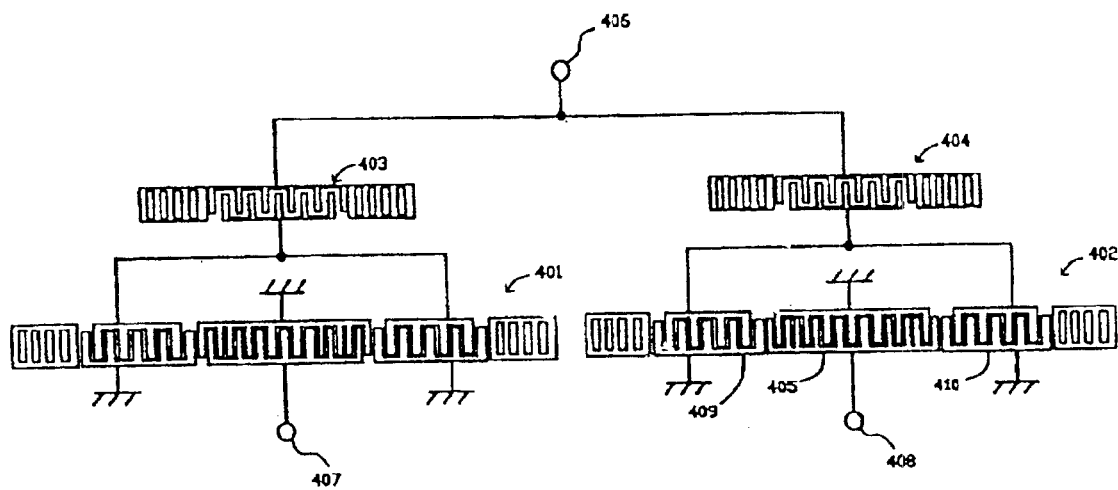
FIG. 13 is a schematic plan view of a third preferred embodiment of the present invention.

Hereinafter, the configuration of a third preferred embodiment according to the present invention will be described with reference to FIG. 13. FIG. 13 is a schematic plan view showing the configuration of the third preferred embodiment of the present invention.

In the third preferred embodiment, two longitudinally coupled resonator type surface acoustic wave filters according to the first preferred embodiment are connected in parallel to each other to define a surface acoustic wave device having an unbalanced-balanced conversion function with an input of about 50Ω and an output of about 200Ω. The details of the design parameters of the longitudinally coupled resonator type surface acoustic wave filters 401 and 402 and surface acoustic wave resonators 403 and 404 are preferably the same as those of the surface acoustic wave filter of FIG. 1 except that the meshing width of each of the filters 401 and 402 and the resonators 403 and 404 is approximately half of the meshing-width in the surface acoustic wave device of the first preferred embodiment, and the electrode inversion is carried out for IDT 405 of the longitudinally coupled resonator type surface acoustic wave filter 402. The electrode inversion of the IDT 405 of the longitudinally coupled resonator type surface acoustic wave filter 402 is carried out to reverse the phase by approximately 180° with respect to an output signal from the longitudinally coupled resonator type surface acoustic wave filter 401. However, a method of reversing the phase by about 180° is not limited to the above-described electrode inversion. As other methods, for example, it is possible that the electrode inversion is carried out for the IDTs 409 and 410, not for the IDT 405, the IDT 405 is divided into two parts without the electrode inversion being carried out, and balanced signals are output therefrom, and so forth. In FIG. 13, an unbalanced input terminal 406, and balanced output terminals 407 and 408 are shown.

In the third preferred embodiment of the present invention shown in FIG. 13, the longitudinally coupled resonator type surface acoustic wave filters according to various preferred embodiments of the present invention are connected in parallel to each other to define a surface acoustic wave device. In this manner, the surface acoustic wave device having a large attenuation on the higher frequency side of the pass band and having a balanced-unbalanced signal conversion function is obtained.

The configuration of the surface acoustic wave device having a large amount of attenuation on the higher frequency side of the pass band and having a balanced-unbalanced signal conversion function is not limited to that of FIG. 13. Even if the surface acoustic wave device has another configuration by which a balanced-unbalanced signal conversion function can be attained, the same effects can be obtained by using the surface acoustic wave filters according to preferred embodiments of the present invention.

Figure 14:
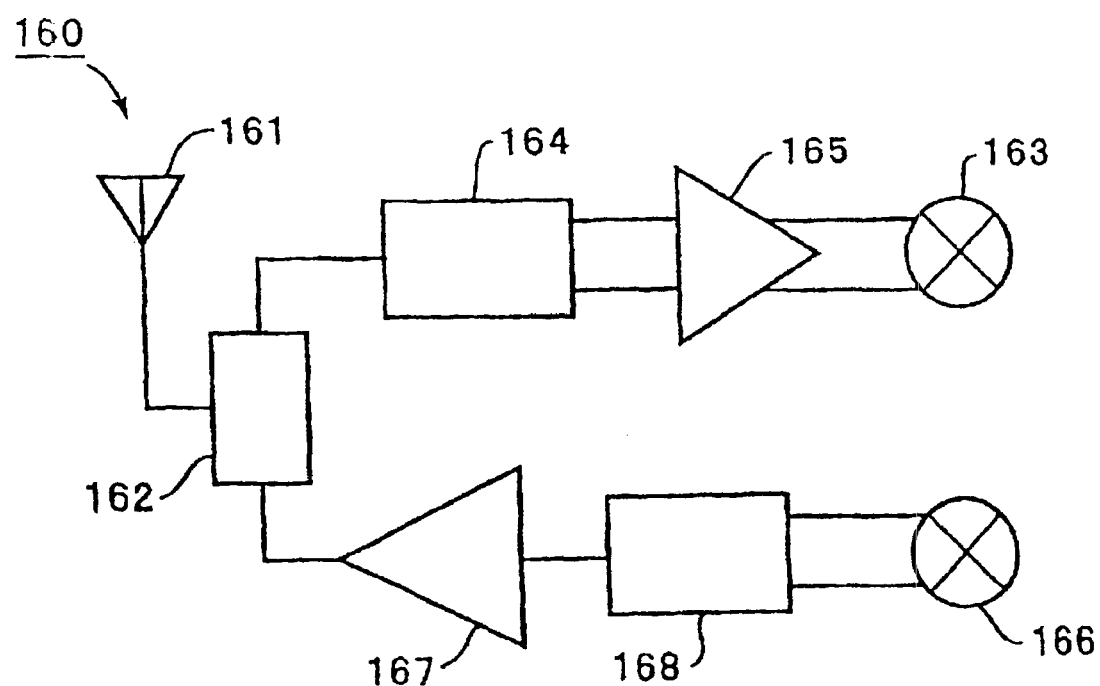
FIG. 14 is a block diagram of a communication device including a longitudinally coupled resonator type surface acoustic wave filter or surface acoustic wave device according to various preferred embodiments of the present invention.

FIG. 14 is a schematic block diagram showing a communication device 160 including the longitudinally coupled resonator type surface acoustic wave filter and the surface acoustic wave device according to preferred embodiments of the present invention.

As shown in FIG. 14, a duplexer 162 is connected to an antenna 161. A longitudinally coupled resonator type surface acoustic wave filter 164 and an amplifier 165 are connected between the duplexer 162 and a reception-side mixer 163. Moreover, an amplifier 167 and a longitudinally coupled resonator type surface acoustic wave filter 168 are connected between the duplexer 162 and a transmission-side mixer 166. When the amplifier 165 corresponds to balanced signals as described above, the longitudinally coupled resonator type surface acoustic wave filter according to preferred embodiments of the present invention can be suitably used as the above-described longitudinally coupled resonator type surface acoustic wave filter 164.

Moreover, the surface acoustic wave device configured according to preferred embodiments of the present invention can be disposed instead of the longitudinally coupled resonator type surface acoustic wave filter 164. The surface acoustic wave device can be suitably used as well as the longitudinally coupled resonator type surface acoustic wave filter according to preferred embodiments of the present invention.

The surface acoustic wave device having a reduced transversal response can be obtained, since electrode-inversion is carried out, that is, the polarities of two adjacent electrode fingers are made the same as described above. Moreover, when the position for the electrode inversion is located approximately at the center of a small pitch electrode finger portion, the longitudinally coupled resonator type surface acoustic wave filter having a very large pass band width and a greatly reduced transversal response is obtained.

The electrode inversion is preferably carried out symmetrically with respect to the approximate center of the surface acoustic wave filter, and thereby, the longitudinally coupled resonator type surface acoustic wave filter which eliminates a ripple from the pass band and has a reduced transversal response can be obtained.

Moreover, since the polarities of the adjacent electrode fingers contained in the adjacent IDTs, respectively, are preferably made different, the longitudinally coupled resonator type surface acoustic wave filter of which the transversal response is reduced in an even wider range can be obtained.

Preferably, the surface acoustic wave filter according to preferred embodiments of the present invention is applied for the longitudinally coupled resonator type surface acoustic wave device having a balanced-unbalanced signal conversion function. Thus, the surface acoustic wave device having the balanced-unbalanced signal conversion function of which the attenuation on the higher frequency side of the pass band is superior can be obtained.

The communication device having very high communication qualities and high reliability is obtained, since the device uses the longitudinally coupled resonator type surface acoustic wave filter or the surface acoustic wave device according to preferred embodiments of the present invention.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A longitudinally coupled resonator type surface acoustic wave filter comprising:
   a piezoelectric substrate; and
   at least two interdigital transducers arranged on the piezoelectric substrate along a direction in which a surface acoustic wave is propagated; wherein
   at least one of the at least two interdigital transducers includes a small pitch electrode finger portion at one end thereof which is adjacent to the other of the at least two interdigital transducers, the small pitch electrode finger portion having electrode fingers of which a pitch is smaller than that of the other electrode fingers in said at least one of the at least two interdigital transducers;
   the small pitch electrode finger portion including two adjacent electrode fingers in at least one position thereof which are electrode-inverted such that the polarities of the two adjacent electrode fingers are the same.

2. A longitudinally coupled resonator type surface acoustic wave filter according to claim 1, wherein the position of the electrode-inversion is located approximately at the center of the small pitch electrode finger portion.

3. A longitudinally coupled resonator type surface acoustic wave filter according to claim 1, wherein the electrode-inversion is symmetrical with respect to the approximate center of the surface acoustic wave filter.

4. A longitudinally coupled resonator type surface acoustic wave filter according to claim 1, wherein the polarities of the adjacent electrode fingers in the adjacent interdigital transducers, respectively, are different.

5. A longitudinally coupled resonator type surface acoustic wave filter according to claim 1, wherein the filter is adapted for use in a PCS-Rx system.

6. A longitudinally coupled resonator type surface acoustic wave filter according to claim 1, wherein piezoelectric substrate is made of 40±5° Y-cut X-propagation $LiTaO_3$.

7. A longitudinally coupled resonator type surface acoustic wave filter according to claim 1, wherein three of the interdigital electrodes and two reflectors are disposed on the piezoelectric substrate such that the two reflectors sandwich the three interdigital electrodes.

8. A longitudinally coupled resonator type surface acoustic wave filter according to claim 1, wherein a surface acoustic wave resonator is provided on the piezoelectric substrate and is connected in series with the at least two interdigital electrodes.

9. A surface acoustic wave device having a balanced-unbalanced conversion function and comprising the longitudinally coupled resonator type surface acoustic wave filter according to claim 1.

10. A communication device including the surface acoustic wave device according to claim 9.

11. A communication device including the longitudinally coupled resonator type surface acoustic wave filter according to claim 1.

12. A surface acoustic wave device comprising at least two of the longitudinally coupled resonator type surface acoustic wave filters according to claim 1 being connected to each other in parallel.

13. A communication device including the surface acoustic wave device according to claim 12.

* * * * *